(12) United States Patent
Yoon et al.

(10) Patent No.: US 12,163,904 B2
(45) Date of Patent: Dec. 10, 2024

(54) QUANTITATIVE ANALYSIS METHOD OF CARBON BASED HYBRID NEGATIVE ELECTRODE

(71) Applicant: LG ENERGY SOLUTION, LTD., Seoul (KR)

(72) Inventors: Hyo-Jung Yoon, Daejeon (KR); So-Young Kim, Daejeon (KR); Eun-Ju Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 275 days.

(21) Appl. No.: 17/771,866

(22) PCT Filed: Nov. 4, 2020

(86) PCT No.: PCT/KR2020/015348
§ 371 (c)(1),
(2) Date: Apr. 26, 2022

(87) PCT Pub. No.: WO2021/091235
PCT Pub. Date: May 14, 2021

(65) Prior Publication Data
US 2022/0373483 A1 Nov. 24, 2022

(30) Foreign Application Priority Data
Nov. 4, 2019 (KR) .................. 10-2019-0139764

(51) Int. Cl.
*G01N 23/207* (2018.01)
(52) U.S. Cl.
CPC ............ *G01N 23/207* (2013.01); *G01N 2223/1016* (2013.01); *G01N 2223/60* (2013.01)
(58) Field of Classification Search
CPC ....... G01N 2223/1016; G01N 2223/60; G01N 2223/605; G01N 23/2055; G01N 23/207;
(Continued)

(56) References Cited

U.S. PATENT DOCUMENTS

2009/0155687 A1 6/2009 Im et al.
2011/0039162 A1 2/2011 Maeda
(Continued)

FOREIGN PATENT DOCUMENTS

JP 8-189907 A 7/1996
JP 2009-176533 A 8/2009
(Continued)

OTHER PUBLICATIONS

European Patent Application Search report dated Oct. 14, 2022 for European Patent Application No. 20884143.7.
(Continued)

*Primary Examiner* — Irakli Kiknadze
(74) *Attorney, Agent, or Firm* — Birch, Stewart, Kolasch & Birch, LLP

(57) ABSTRACT

A method of quantitatively analyzing a carbon based hybrid negative electrode including the steps of preparing a secondary battery including a carbon based hybrid negative electrode, where the carbon based hybrid negative electrode comprises a carbon based negative electrode active material and a non-carbon based negative electrode active material, measuring a lattice d-spacing of the carbon based negative electrode active material in the carbon based hybrid negative electrode during charging/discharging of the secondary battery using an X-ray diffractometer and then plotting a graph of a change in lattice d-spacing value as a function of charge/discharge capacity, detecting an inflection point of a slope of the graph during discharging; and then, quantifying capacity contribution of the carbon based negative electrode active material and the non-carbon based negative electrode active material in the total discharge capacity of the secondary battery by the inflection point of the slope of the graph.

9 Claims, 15 Drawing Sheets

(58) Field of Classification Search
CPC ....... G01N 23/20; Y02E 60/10; Y02E 60/122; G01R 31/387; G01R 31/392; H01M 4/133; H01M 10/0525; H01M 10/42; H01M 10/4285; H01M 4/587; H01M 4/483; H01M 4/386; H01M 10/052; H01M 4/38; H01M 4/40; H01M 4/48; H01M 4/387; H01M 4/525; H01M 4/505; H01M 10/0562; H01M 2300/0068
USPC .......................................................... 378/71
See application file for complete search history.

(56) References Cited

U.S. PATENT DOCUMENTS

| | | | | |
|---|---|---|---|---|
| 2014/0199577 | A1* | 7/2014 | Bhavaraju | H01M 6/185 |
| | | | | 429/105 |
| 2016/0158032 | A1 | 6/2016 | Lee et al. | |
| 2018/0351208 | A1* | 12/2018 | Shibata | C23C 16/45531 |
| 2020/0243920 | A1* | 7/2020 | Yoon | G01R 31/389 |
| 2021/0296646 | A1* | 9/2021 | Kuroda | H01M 4/366 |

FOREIGN PATENT DOCUMENTS

| | | |
|---|---|---|
| KR | 10-2009-0066020 A | 6/2009 |
| KR | 10-2011-0016378 A | 2/2011 |
| KR | 10-2011-0134793 A | 12/2011 |
| KR | 10-2016-0064881 A | 6/2016 |
| KR | 10-1802482 B1 | 11/2017 |

OTHER PUBLICATIONS

Finegan et al.: "Spatially Resolving Lithiation in Silicon-Graphite Composite Electrodes via in Situ High-Energy X-ray Diffraction Computed Tomography", Nano Letters, vol. 19, No. 6, Jun. 12, 2019, pp. 3811-3820, XP055891340, US ISSN: 1530-6984, DOI: 10.1021/acs.nanolett.9b00955.

Hu et al., "Cyclability evaluation on Si based Negative Electrode in Lithium ion Battery by Graphite Phase Evolution: an operando X-ray diffraction study", Scientific Report, 2019, No. 9, Article No. 1299, Total 10 pages.

International Search Report (PCT/ISA/210) Issued in PCT/KR2020/015348 mailed on Feb. 3, 2021.

Park et al., "In situ XRD study of the structural changes of graphite anodes mixed with $SiO_x$ during lithium insertion and extraction in lithium ion batteries", Electrochimica Acta, 2013, vol. 107, pp. 467-472.

Wilhelm et al., "In Situ Neutron Diffraction Study of Lithiation Gradients in Graphite Anodes during Discharge and Relaxation", Journal of The Electrochemical Society, 2018, vol. 165, Issue. 9, pp. A1846-A1856.

Yao et al., "Quantifying lithium concentration gradients in the graphite electrode of Li-ion cells using operando energy dispersive X-ray diffraction", Energy & Environmental Science, 2019, vol. 12, pp. 656-665.

Zhu et al., "Application of Operando X-ray Diffraction and Raman Spectroscopies in Elucidating the Behavior of Cathode in Lithium-Ion Batteries", Frontiers in Energy Research, 2018, vol. 6, Article 66, pp. 1-16.

* cited by examiner

QUANTITATIVE ANALYSIS METHOD OF CARBON BASED HYBRID NEGATIVE ELECTRODE

TECHNICAL FIELD

The present disclosure relates to a quantitative analysis method of a carbon based hybrid negative electrode.

The present application claims the benefit of Korean Patent Application No. 10-2019-0139764 filed on Nov. 4, 2019 with the Korean. Intellectual Property Office, the disclosure of which is incorporated herein by reference in its entirety.

BACKGROUND ART

Recently, with the rapid growth of the market of electric vehicles, robots and energy storage systems, there is a demand for secondary batteries with high energy density, stability, compactness, lightweight and long service life. For large scale applications, it is important to improve the performance of the secondary batteries for higher energy density per weight or volume than the current level of energy density.

Graphite is a negative electrode active material of currently available lithium ion batteries, and it has the limited theoretical capacity of 372 mAh/g (about 160 Wh/kg). As a next-generation negative electrode material of nonaqueous electrolyte secondary batteries, attention is directed to silicon (Si) having the capacity (4200 mAh/g) that is at least 10 times higher than that of graphite. Additionally, it has been proposed to use a variety of non-carbon based materials including silicon showing high theoretical capacity when forming alloy with lithium, as a new material for the negative electrode active material, in place of carbon based materials such as graphite.

However, Si-based materials may cause cracks in the electrode and on the electrode surface and splitting failures of the active material due to the high volume expansion rate during alloying with lithium, resulting in the electrical contact reduction and sharp reduction in cycle capacity of secondary batteries. To solve the problem of the Si-based materials, many attempts have been made to apply a hybrid negative electrode including a mixture of non-carbon based materials such as Si-based materials and carbon based materials.

To improve the battery performance by increasing the energy density of the secondary battery comprising the hybrid negative electrode, it is necessary to perform analysis and degradation diagnosis for each of the carbon based material and the non-carbon based material of the hybrid negative electrode in the lithiation and delithiation behaviors of lithium ions during the charge/discharge of the secondary battery.

DISCLOSURE

Technical Problem

The present disclosure is directed to providing a quantitative analysis method of a carbon based hybrid negative electrode.

These and other objects and advantages of the present disclosure will be understood by the following description. Meanwhile, it will be easily understood that the objects and advantages of the present disclosure may be realized by the means or method set forth in the appended claims and a combination thereof.

Technical Solution

To solve the above-described problem of the present disclosure, according to an aspect of the present disclosure, there is provided a quantitative analysis method of a carbon based hybrid negative electrode according to the following embodiment.

According to a first embodiment, there is provided the method of quantitatively analyzing a carbon based hybrid negative electrode comprising preparing a secondary battery comprising a carbon based hybrid negative electrode, wherein the carbon based hybrid negative electrode may comprise a carbon based negative electrode active material and a non-carbon based negative electrode active material; measuring a lattice d-spacing of the carbon based negative electrode active material in the carbon based hybrid negative electrode during charging/discharging of the secondary battery using an X-ray diffractometer, plotting a graph of a change in lattice d-spacing value as a function of charge/discharge capacity; detecting an inflection point of a slope of the graph during discharging; and quantifying capacity contribution of the carbon based negative electrode active material and the non-carbon based negative electrode active material in the total discharge capacity of the secondary battery by the inflection point of the slope of the graph.

According to a second embodiment, in the first embodiment, the discharge capacity after the inflection point may correspond to the capacity contribution of the non-carbon based negative electrode active material, and the discharge capacity before the inflection point may correspond to the capacity contribution of the carbon based negative electrode active material.

According to a third embodiment, in the first or second embodiment, the capacity contribution of the non-carbon based negative electrode active material in the carbon based hybrid negative electrode may be quantified by calculating a ratio of the discharge capacity after the inflection point to a maximum capacity of the graph.

According to a fourth embodiment, in any one of the first to third embodiments, when capacity characteristics degrade as the secondary battery is charged/discharged multiple times, a change in the inflection point location of the slope of the graph during charge/discharge after degradation by the multiple charge/discharge is compared to the inflection point of the slope of the graph during initial charge/discharge to determine a cause of degradation of the secondary battery.

According to a fifth embodiment, in any one of the first to fourth embodiments, as a result of analyzing the inflection point location of the slope of the graph during charge/discharge after degradation compared to the inflection point location of the slope of the graph during initial charge/discharge, a reduction in capacity from the inflection point to the maximum capacity may be determined as a degradation of the carbon based negative electrode active material, and a reduction in capacity from the inflection point to capacity 0 may be determined as a degradation of the non-carbon based negative electrode active material.

According to a sixth embodiment, in any one of the first to fifth embodiments, the carbon based negative electrode active material may comprise at least one of natural graphite, artificial graphite, soft carbon, hard carbon, pitch carbide, sintered cokes, graphene, or carbon nano tubes.

According to a seventh embodiment, in any one of the first to sixth embodiments, the non-carbon based negative electrode active material may comprise a metal or metalloid capable of forming an alloy with lithium.

According to an eighth embodiment, in any one of the first to seventh embodiments, the non-carbon based negative electrode active material may comprise at least one of a metal or metalloid selected from Si, Sn, In, Pb, Ga, Ge, Al, Bi, Sb, Ag, Mg, Zn, Pt, or Ti; an oxide of the metal or metalloid; a carbon composite of the metal or metalloid; or a carbon composite of the metal or metalloid oxide.

According to a ninth embodiment, in any one of the first to eighth embodiments, the non-carbon based negative electrode active material may comprise at least one of Si or $SiO_x$, wherein $0<x<2$.

Advantageous Effects

According to an embodiment of the present disclosure, it is possible to quantify the main reaction range and capacity contribution of the non-carbon based material in the singular behaviors of the non-carbon based material separated from the combined behaviors of the carbon based material and the non-carbon based material by observing a change in the lattice d-spacing of the carbon based material during the charge and discharge of the full cell secondary battery comprising the carbon based hybrid negative electrode including the carbon based material and the non-carbon based material by the non-destructive analysis method.

Additionally, when the secondary battery comprising the carbon based hybrid negative electrode degrades, as opposed to the conventional art that was difficult to find the cause of the degradation, according to an embodiment of the present disclosure, it is possible to separately analyze which is the cause of degradation of the negative electrode, the carbon based material or the non-carbon based material.

BRIEF DESCRIPTION OF THE DRAWINGS

The accompanying drawings illustrate preferred embodiments of the present disclosure, and together with the following detailed disclosure, serve to help the understanding of the technical aspect of the present disclosure, and thus the present disclosure should not be interpreted as being limited thereto. Meanwhile, the shape, size, scale or proportion of the elements in the drawings may be exaggerated to put emphasis on clearer description.

DETAILED DESCRIPTION

Figure 1:
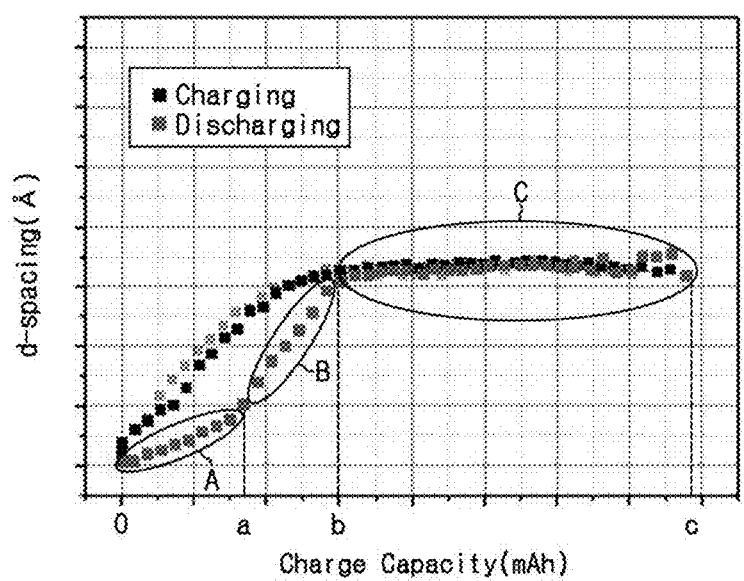
FIG. 1 is a graph showing changes in lattice d-spacing of a carbon based negative electrode active material included in a carbon based hybrid negative electrode with changes in capacity during the charge and discharge of a secondary battery comprising the negative electrode.

It should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation. Therefore, the configuration shown in the embodiments described herein is just a most preferred embodiment of the present disclosure, but not intended to fully describe the technical aspects of the present disclosure, so it should be understood that a variety of other equivalents and modifications could have been made thereto at the time that the application was filed.

The present disclosure is developed to solve the conventional problem that it is difficult to analyze and diagnose a degradation in the lithiation and delithiation behaviors for each of a carbon based material and a non-carbon based material during the charge/discharge of the carbon based material and the non-carbon based material in a charging/discharging environment of a secondary battery comprising a carbon based hybrid negative electrode.

The present disclosure directly observes the behaviors of a mixed electrode of a carbon based material and a non-carbon based material by operando analysis during the charge/discharge of a secondary battery comprising a carbon based hybrid negative electrode, by a non-destructive analysis method using a full-cell secondary battery.

A secondary battery using a carbon based negative electrode active material alone does not have competitive lithiation and delithiation of lithium ions in the negative electrode active material. However, in the hybrid negative electrode condition including both the carbon based negative electrode active material and the non-carbon based negative electrode active material, the carbon based negative electrode active material competes with the non-carbon based negative electrode active material for lithiation and delithiation of lithium ions according to the reaction voltage, and thus the decelerated accelerated lithiation and delithiation of lithium ions may be observed.

An increase or decrease in the lattice d-spacing of a carbon layer of the carbon based negative electrode active material reflects such a change. Through this, it is possible to quantify the main reaction range and capacity of the non-carbon based negative electrode active material in the behaviors of each of the carbon based negative electrode active material and the non-carbon based negative electrode active material in the hybrid negative electrode.

A quantitative analysis method of a carbon based hybrid negative electrode according to an aspect of the present disclosure includes:

preparing a secondary battery comprising a carbon based hybrid negative electrode comprising a carbon based negative electrode active material and a non-carbon based negative electrode active material;

measuring the lattice d-spacing of the carbon based negative electrode active material in the carbon based hybrid negative electrode during charging/discharging of the secondary battery using an X-ray diffractometer, and plotting a graph of changes in the lattice d-spacing value as a function of charge/discharge capacity (X axis); and quantifying the capacity contribution of the carbon based negative electrode active material and the non-carbon based negative electrode active material to the total discharge capacity of the secondary battery by detecting an inflection point (an inflection point at which the slope changes from a large value to a small value) of the slope of the graph during discharging in the plotted graph.

First, the secondary battery comprising the carbon based hybrid negative electrode including the carbon based negative electrode active material and the non-carbon based negative electrode active material is prepared.

The carbon based hybrid negative electrode refers to a negative electrode including not only the carbon based negative electrode active material but also the non-carbon based negative electrode active material as the negative electrode active material.

The carbon based negative electrode active material includes any type of carbon based material that allows lithiation and delithiation during the charge/discharge of the battery, and is not limited to a particular type. The carbon based negative electrode active material may include amorphous carbon, crystalline carbon, or a mixture thereof. Specifically, the carbon based negative electrode active material may include natural graphite, artificial graphite, soft carbon, hard carbon, pitch carbide, sintered cokes, graphene, carbon nano tubes, or at least two thereof. In particular, graphite is a negative electrode material commonly in lithium secondary batteries, and when mixed with silicon to manufacture an electrode, graphite stably ensures its capacity, has good initial efficiency, and can compensate for low initial efficiency of a silicon-based negative electrode material. Since these advantages contribute to the increase in initial efficiency of the electrode, graphite-based materials such as artificial graphite or natural graphite are desirable.

The non-carbon based negative electrode active material includes any material that can form an alloy with lithium, and is not limited to a particular type. Specifically, the non-carbon based negative electrode active material may include a metal or metalloid selected from Si, Sn, In, Pb, Ga, Ge, Al, Bi, Sb, Ag, Mg, Zn, Pt, Ti or a combination thereof; an oxide of the metal or metalloid such as $SiO_x$ (0<x<2), SnO, $SnO_2$, $TiO_2$; a carbon composite of the metal or metalloid; a carbon composite of the metal or metalloid oxide, or a mixture thereof.

According to an embodiment of the present disclosure, the non-carbon based negative electrode active material may include Si, $SiO_x$ (0<x<2) or a mixture thereof.

The carbon based hybrid negative electrode according to an embodiment of the present disclosure may be prepared by coating a mixture of the negative electrode active material including the carbon based negative electrode active material and the non-carbon based negative electrode active material, a conductive material and a binder on a negative electrode current collector and drying, and if necessary, the mixture may further include fillers.

In an embodiment of the present disclosure, the current collector is generally 3 to 500 μm in thickness. The current collector may include, without limitation, any type having high conductivity while not causing a chemical change to the corresponding battery, and for example, stainless steel, aluminum, nickel, titanium, sintered carbon, or aluminum or stainless steel surface-treated with carbon, nickel, titanium and silver. They may be appropriately selected and used depending on the polarity of the positive electrode or the negative electrode.

The binder helps the bonding between the active material and the conductive material and the bonding to the current collector, and is generally added in an amount of 1 to 50 weight % based on the total weight of the electrode material. The binder may include high molecular weight polyacrylonitrile-acrylic acid copolymer, but is not limited thereto. In another example, the binder may include polyvinylidene fluoride, polyvinylalcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene ter polymer (EPDM), sulfonated EPDM, styrene-butadiene rubber (SBR), polyacrylate, alkali cation or ammonium ion substituted polyacrylate, alkali cation or ammonium ion substituted poly(alkylene-co-maleic anhydride), alkali cation or ammonium ion substituted poly(alkylene-co-maleic acid), polyethylene oxide, fluorine rubber, or a mixture thereof. More specifically, the alkali cation substituted polyacrylate may include lithium-polyacrylate (Li-PAA), and the alkali cation substituted poly(alkylene-co-maleic anhydride) may include lithium substituted polyisobutylene-maleic anhydride.

The conductive material may include any type of material that does not cause a chemical change to the battery, and for example, graphite such as natural graphite or artificial graphite; carbon black such as carbon black, acetylene black, ketjen black (trade name), carbon nano tubes, carbon nano fiber, channel black, furnace black, lamp black, thermal black, conductive fiber such as carbon fiber or metal fiber, metal powder such as fluorocarbon, aluminum, nickel powder; conductive whiskers such as zinc oxide, potassium titanate, conductive metal oxide such as titanium oxide; conductive materials such as polyphenylene derivatives.

According to an embodiment of the present disclosure, when preparing the negative electrode by coating the mixture of the negative electrode active material including the carbon based negative electrode active material and the non-carbon based negative electrode active material, the conductive material and the binder on the negative electrode current collector, the negative electrode may be prepared by a dry method of directly coating a solid mixture including the negative electrode active material, the conductive material and the binder, and a wet method of adding the negative electrode active material, the conductive material and the binder to a dispersion medium, stirring, coating in the form of a slurry and drying to remove the dispersion medium. In this instance, the dispersion medium used in the wet method may include an aqueous medium such as water (deionized water), or an organic medium such as N-methyl-2-pyrrolidone (NMP) and acetone.

According to an embodiment of the present disclosure, the structure of the negative electrode may be a single layer structure including the carbon based negative electrode active material and the non-carbon based negative electrode active material, a double layer structure in which a layer including the carbon based negative electrode active material alone as the active material and a layer including the non-carbon based negative electrode active material alone are separately formed and stacked, or a structure in which at least one of a layer including the carbon based negative electrode active material alone as the active material or a layer including the noncarbon based negative electrode active material alone may be stacked in multiple layers in an alternating manner.

The secondary battery according to an embodiment of the present disclosure includes the carbon based hybrid negative electrode, a positive electrode, and a separator interposed between the positive electrode and the negative electrode.

The positive electrode may be prepared by coating a mixture of a positive electrode active material, a conductive material and a binder on a positive electrode current collector and drying, and if necessary, the mixture may further include fillers. The positive electrode active material may include layered compounds such as lithium cobalt oxide ($LiCoO_2$), lithium nickel oxide ($LiNiO_2$) or compounds with one or more transition metal substitution; lithium manganese oxide of $Li_{1+x}Mn_{2-x}O_4$ (x=0~0.33), $LiMnO_3$, $LiMn_2O_3$, $LiMnO_2$; lithium copper oxide ($Li_2CuO_2$); vanadium oxide such as $LiV_3O_8$, $LiFe_3O_4$, $V_2O_5$, $Cu_2V_2O_7$; Ni-site type lithium nickel oxide represented by formula $LiNi_{1-x}MxO_2$ (M=Co, Mn, Al, Cu, Fe, Mg, B or Ga, x=0.01~0.3); lithium manganese composite oxide represented by formula $LiMn_{2-x}M_xO_2$ (M=Co, Ni, Fe, Cr, Zn or Ta, x=0.01~0.1) or $Li_2Mn_3MO_8$ (M=Fe, Co, Ni, Cu or Zn); $LiMn_2O_4$ with partial substitution of alkali earth metal ion for Li in Formula; disulfide compounds; and $Fe_2(MoO_4)_3$, but is not limited thereto.

For the conductive material, the current collector and the binder of the positive electrode, reference may be made to the above description of the negative electrode.

The separator is interposed between the positive electrode and the negative electrode, and includes an insulating thin film having high ion permittivity and mechanical strength. The separator generally has a pore size of 0.01 to 10 μm, and is generally 5 to 300 μm in thickness. The separator includes, for example, a film, a sheet or a non-woven fabric made of olefin-based polymer with chemical resistance and hydrophobic property such as polypropylene; glass fibers or polyethylene. Meanwhile, the separator may further include a porous layer including a mixture of inorganic particles and a binder resin on the outermost surface.

In an embodiment of the present disclosure, an electrolyte solution includes an organic solvent and a predetermined amount of lithium salt, and the organic solvent includes, for example, propylene carbonate (PC), ethylene carbonate (EC), butylene carbonate (BC), diethylcarbonate (DEC), dimethylcarbonate (DMC), dipropylcarbonate (DPC), methyl propionate (MP), dimethylsulfoxide, acetonitrile, dimethoxyethane, diethoxyethane, tetrahydrofurane, N-methyl-2-pyrrolidone (NMP), ethylmethylcarbonate (EMC), vinylenecarbonate (VC), gamma butyrolactone (GBL), fluoroethylene carbonate (FEC), methyl formate, ethyl formate, propyl formate, methyl acetate, ethyl acetate, propyl acetate, pentyl acetate, ethyl propionate, butyl propionate, or a mixture thereof. Halogen derivatives of the organic solvent may be used, and linear esters may be used. The lithium salt may include materials that dissolve well in the nonaqueous electrolyte, and for example, LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloro borane lithium, lower aliphatic carboxylic acid lithium, lithium tetraphenyl borate and imide.

The secondary battery according to an embodiment of the present disclosure may be manufactured by receiving an electrode assembly including the positive electrode and the negative electrode stacked in an alternating manner together with the separator in a packaging such as a battery case together with the electrolyte solution, followed by sealing. A method for manufacturing the secondary battery may include any common method without limitation.

According to an embodiment of the present disclosure, there are provided a battery module including the secondary battery as a unit cell and a battery pack including the same. As the battery module and the battery pack include the secondary battery showing rapid charge characteristics at high loading, they may be used as a power source of electric vehicles, hybrid electric vehicles, plug-in hybrid electric vehicles and energy storage systems.

Meanwhile, for battery components not described herein, for example, a conductive material, reference may be made to the description of components commonly used in the field of batteries, especially, lithium secondary batteries.

Subsequently, the lattice d-spacing of the carbon based negative electrode active material in the carbon based hybrid negative electrode is measured during the charge/discharge of the secondary battery using an X-ray diffractometer, and a graph of changes in lattice d-spacing value as a function of the charge/discharge capacity (X axis) is plotted.

Figure 5:
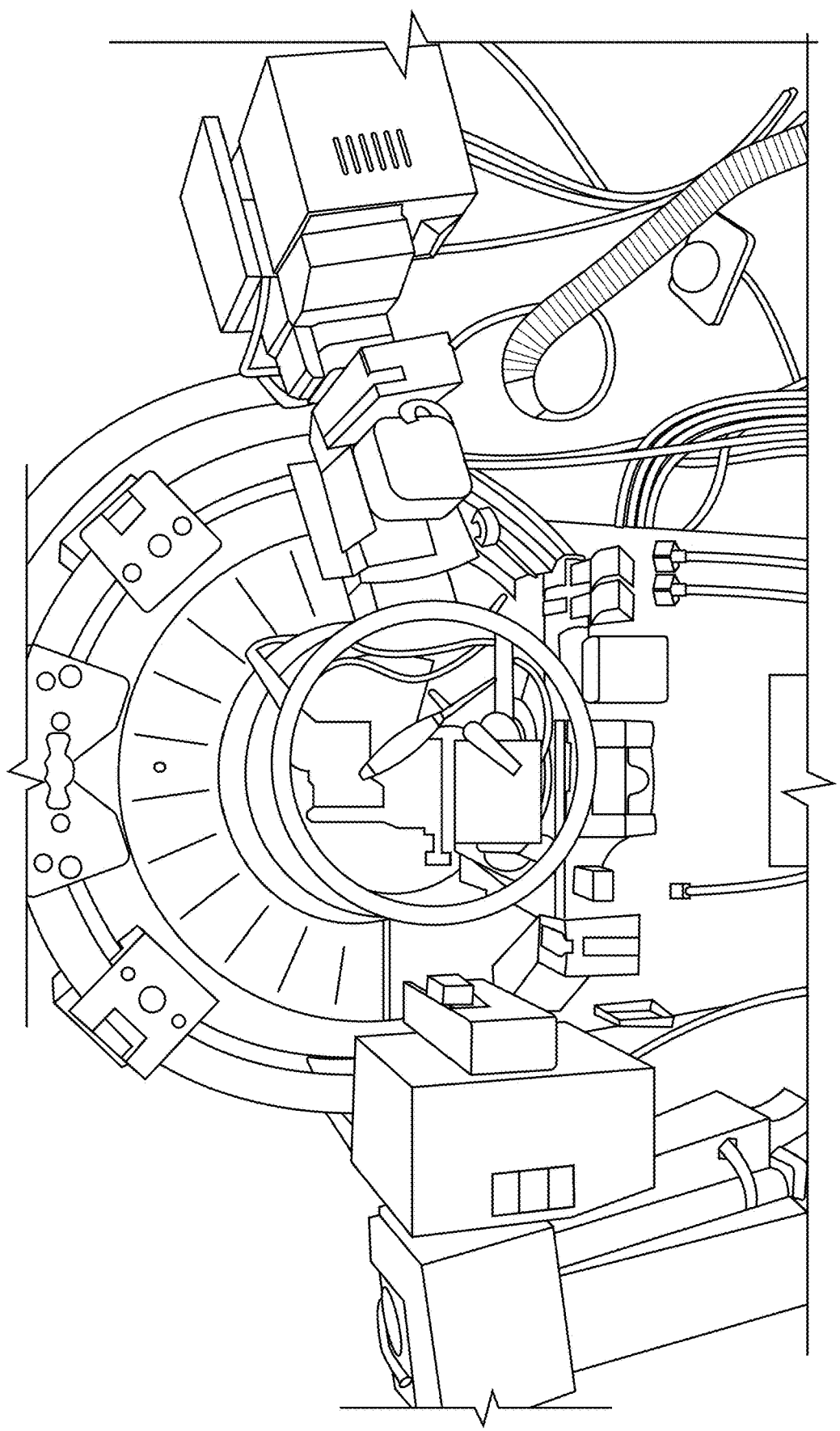
FIG. 5 is a photographic image showing a transmission x-ray diffractometer.
Figure 5:
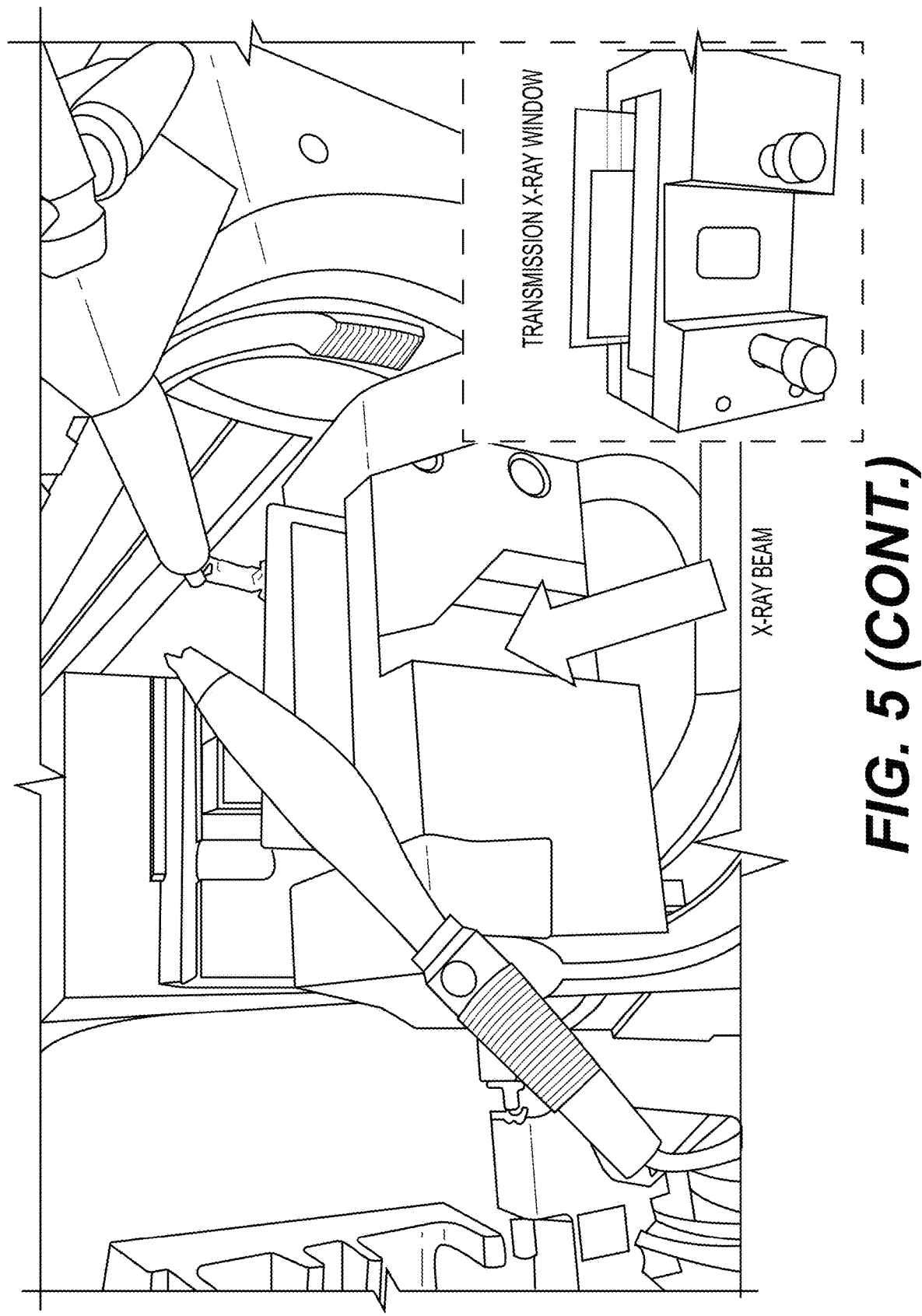

According to an embodiment of the present disclosure, during the charge/discharge of the secondary battery, scanning may be performed while tracking (002) lattice interface peak (2θ=7.5~11 (Ag λ=0.56)) of the carbon based negative electrode active material (for example, graphite) included in the carbon based hybrid negative electrode of the secondary battery. The lattice d-spacing of the carbon based negative electrode active material may be calculated by fitting the (002) lattice interface peak of the carbon based negative electrode active material included in the negative electrode obtained by scanning (for details of an example of application, see FIG. 5).

Subsequently, the capacity contribution of the carbon based negative electrode active material and the non-carbon based negative electrode active material to the total discharge capacity of the secondary battery is quantified by detecting an inflection point (an inflection point at which the slope changes from a large value to a small value) of the slope of the graph during discharging in the plotted graph.

The discharge capacity (moderate slope) after the inflection point may correspond to the capacity contribution of the non-carbon based negative electrode active material, and the discharge capacity (steep slope) before the inflection point may correspond to the capacity contribution of the carbon based negative electrode active material.

Referring to FIG. 1, the discharge capacity (moderate slope) after the inflection point, i.e., the capacity contribution of the non-carbon based negative electrode active material may be a (mAh), and the discharge capacity (steep slope) before the inflection point, i.e., the capacity contribution of the carbon based negative electrode active material may be b−a (mAh).

Accordingly, the capacity contribution of the non-carbon based negative electrode active material in the carbon based hybrid negative electrode may be quantified by calculating a ratio (a/c) of the discharge capacity (a) after the inflection point to the maximum capacity (c) in the graph.

When the capacity characteristics degrade with the in creasing charge/discharge cycles of the secondary battery, determination may be de as to which is the degradation cause of the secondary battery, the carbon based negative electrode active material or the non-carbon based negative electrode active material, through a change in the inflection point location of the slope of the graph during charging/discharging after degradation with the increasing charge/discharge cycles compared to the inflection point location of the slope of the graph during initial charge/discharge.

As a result of analyzing the inflection point location of the slope of the graph during charging/discharging after degradation compared to the infection point location of the slope of the graph during initial charge/discharge, when comparing with the graph during initial charge/discharge, a reduction in capacity from the inflection point to the maximum capacity (B+C=(B: steep slope)+(C: plateau) in FIG. 1), i.e., a reduction c−a [=(b−a)+(c−b)], may be determined as a degradation of the carbon based negative electrode active material, and a reduction in capacity from the inflection point to capacity 0 (A (moderate slope) in FIG. 1), i.e., a reduction in a, may be determined as a degradation of the non-carbon based negative electrode active material.

That is, the range from the inflection point to the maximum capacity corresponds to the capacity contribution of the carbon based negative electrode active material, and the range from the inflection point to capacity 0 corresponds to the capacity contribution of the non-carbon based negative electrode active material. Accordingly, the reduction from the inflection point to the maximum capacity indicates a reduction in the capacity contribution of the carbon based negative electrode active material, and it may be determined as a degradation of the carbon based negative electrode active material. Likewise, the reduction from the inflection point to capacity 0 indicates a reduction in the capacity contribution of the non-carbon based negative electrode active material, and it may be determined as a degradation of the non-carbon based negative electrode active material.

Hereinafter, to help the understanding of the present disclosure, the present disclosure will be described in detail through the following preparation examples and experimental examples. However, the preparation examples and experimental examples according to an embodiment of the present disclosure may be modified in many different forms, and the scope of the present disclosure should not be interpreted as being limited to the following preparation examples and experimental examples. The preparation examples and experimental examples of the present disclosure are provided to help those having ordinary skill in the art to understand the present disclosure fully and completely.

Preparation Example 1

<Preparation of Negative Electrode: Artificial Graphite Single Layer Structure>

A mixture of artificial graphite as a carbon based active material, a binder polymer (styrene-butadiene rubber (SBR) and carboxymethyl cellulose (CMC)) and carbon black as a conductive material at a weight ratio of 95:3.5:1.5 is mixed with water as a dispersion medium at a weight ratio of the mixture and the dispersion medium of 1:2 to prepare an active material layer slurry. In this instance, a weight ratio of the styrene-butadiene rubber (SBR) and the carboxymethyl cellulose (CMC) is 2.3:1.2.

Using a slot die, the active material layer slurry is coated on one surface of a copper (Cu) film as a 10 μm thick negative electrode current collector, and dried under 1.30° C. vacuum for 1 hour to form an active material layer on the copper film.

The active material layer is roll pressed to prepare a negative electrode having 80 μm thick active material layer of single layer structure. In this instance, a loading amount is 17 mg/cm$^2$ based on the dry weight of the negative electrode active material layer.

<Preparation of Positive Electrode>

Li(Ni$_{0.8}$Mn$_{0.1}$Co$_{0.1}$)O$_2$(NCM-811) as a positive electrode active material, carbon black as a conductive material and polyvinylidene fluoride (PVdF) as a binder are added to N-methylpyrrolidone (NMP) as a solvent at a weight ratio of 96:2:2 to prepare a positive electrode active material slurry. The slurry is coated on one surface of a 15 μm thick aluminum current collector, and dried and pressed in the same condition as the negative electrode to prepare a positive electrode. In this instance, a loading amount is 20 mg/cm$^2$ based on the dry weight of the positive electrode active material layer.

<Preparation of Lithium Secondary Battery>

LiPF$_6$ is dissolved in an organic solvent of ethylene carbonate (EC), propylenecarbonate (PC) and ethylmethyl carbonate (EMC) mixed at a volume ratio of 3:1:6 such that the concentration is 1.0M to prepare a nonaqueous electrolyte solution.

A polyolefin separator is interposed between the positive electrode and the negative electrode prepared as above, and the electrolyte solution is injected to prepare a lithium secondary battery.

Preparation Example 2

<Preparation of Negative Electrode: Double Layer Structure of Artificial Graphite Layer/SiO layer (Including 5 Weight % Of SiO Based on the Total Active Material)>

A mixture of artificial graphite as a carbon based active material, a binder polymer (styrene-butadiene rubber (SBR) and carboxymethyl cellulose (CMC)) and carbon black as a conductive material at a weight ratio of 95:3.5:1.5 is mixed with water as a dispersion medium at a weight ratio of the mixture and the dispersion medium of 1:2 to prepare a first active material layer slurry. In this instance, a weight ratio of the styrene-butadiene rubber (SBR) and the carboxymethyl cellulose (CMC) is 23:12.

A second active material layer slurry is prepared by the same method as the first active material layer slurry, except that artificial graphite is replaced with a non-carbon based active material, silicon oxide (SiO) having Coulombic efficiency of 80% or more at 0.1C charge/discharge, and the SiO is included in an amount of 5 weight % based on the total weight of artificial graphite and SiO.

Using a dual slot die, the first active material layer slurry is coated on one surface of a copper (Cu) film as a 10 μm thick negative electrode current collector, and subsequently the second active material layer slurry is coated on the first active material layer slurry and dried under 130° C. vacuum for 1 hour to form a first active material layer and a second active material layer on the copper film.

The first active material layer and the second active material layer are roll pressed at the same time to prepare a negative electrode having a 80 μm thick double layered active material layer, A loading amount is 17 mg/cm$^2$ based on the dry weight of the negative electrode active material layer.

<Preparation of Positive Electrode>

A positive electrode is prepared by the same method as preparation example 1.

<Preparation of Lithium Secondary Battery>

A nonaqueous electrolyte solution is prepared by the same method as preparation example 1.

A polyolefin separator is interposed between the positive electrode and the negative electrode prepared as above, and the electrolyte solution is injected to prepare a lithium secondary battery.

Preparation Example 3

<Preparation of Negative Electrode: Double Layer Structure of Artificial Graphite Layer/SiO Layer (Including 15 Weight % of SiO Based on the Total Active Material>

A mixture of artificial graphite as a carbon based active material, a binder polymer (styrene-butadiene rubber (SBR) and carboxymethyl cellulose (CMC)), and carbon black as a conductive material at a weight ratio of 95:3.5:1.5 is mixed with water as a dispersion medium at a weight ratio of the mixture acid the dispersion medium of 1:2 to prepare a first active material layer slurry. In this instance, a weight ratio of the styrene-butadiene rubber (SBR) and the carboxymethyl cellulose (CMC) is 2.3:1.2.

A second active material layer slurry is prepared by the same method as the first active material layer slurry, except that artificial graphite is replaced with a non-carbon based active material, silicon oxide (SiO) having Coulombic efficiency of 80% or more at 0.1 C charge/discharge, and the SiO is included in an amount of 15 weight % based on the total weight of artificial graphite and SiO.

Using a dual slot die, the first active material layer slurry is coated on one surface of a copper (Cu) film as a 10 μm thick negative electrode current collector, and subsequently, the second active material layer slurry is coated on the first active material layer slurry and dried under 130° C. vacuum for 1 hour to form a first active material layer and a second active material layer on the copper film.

The first active material layer and the second active material layer are roll pressed at the same time to prepare a negative electrode having a 80 μm thick double layered active material layer. A loading amount is 17 mg/cm$^2$ based on the dry weight of the negative electrode active material layer.

<Preparation of Positive Electrode>

A positive electrode is prepared by the same method as preparation example 1.

<Preparation of Lithium Secondary Battery>

A nonaqueous electrolyte solution is prepared by the same method as preparation example 1.

A polyolefin separator is interposed between the positive electrode and the negative electrode prepared as above and the electrolyte solution is injected to prepare a lithium secondary battery.

Preparation Example 4

<Preparation of Negative Electrode: Negative Electrode of SiO Single Layer Structure>

A mixture of silicon oxide (SiO) having Coulombic efficiency of 80% or more at 0.1 C charge/discharge, a binder polymer (styrene-butadiene rubber (SBR) and carboxymethyl cellulose (CMC)) and carbon black as a conductive material at a weight ratio of 95:3.5:1.5 is mixed with water as a dispersion medium at a weight ratio of the mixture and the dispersion medium of 1:2 to prepare an active material layer slurry. In this instance, a weight ratio of the styrene-butadiene rubber (SBR) and the carboxymethyl cellulose (CMC) is 2.3:1.2.

Using a slot die, the active material layer slurry is coated on one surface of a copper (Cu) film as a 10 μm thick negative electrode current collector and dried under 130° C. vacuum for 1 hour to form an active material layer on the copper film.

The active material layer is roll pressed at the same time to prepare a negative electrode of SiO single layer structure having a 80 μm thick active material layer. A loading amount is 17 mg/cm$^2$ based on the dry weight of the negative electrode active material layer, <Preparation of Half-Coin Cell Secondary Battery>

A half-coin cell secondary battery is prepared by the same method as preparation example 4 except that the prepared negative electrode is used.

Preparation Example 5

<Preparation of Negative Electrode>

A negative electrode of artificial graphite single layer structure is prepared by the same method as preparation example 1.

<Preparation of Half-Coin Cell Secondary Battery>

A 0.3 mm thick lithium film is used as a counter electrode, a polypropylene porous film (30 μm, Celgard) is used as a separator, and an electrolyte solution is prepared by dissolving LiPF$_6$ in an organic solvent of ethylene carbonate (EC) and ethylmethyl carbonate (EMC) mixed at a volume ratio of 3:7 such that the concentration is 1.0M, and dissolving fluoroethylene carbonate (FEC) such that the concentration is 2 weight %. The separator is interposed between the previously prepared negative electrode and the counter electrode, and the electrolyte solution is injected to prepare a 2032 half-coin cell secondary battery having the thickness of 2 mm and diameter of 32 mm.

Preparation Example 6

<Preparation of Negative Electrode>

A negative electrode of double layer structure of artificial graphite layer/SiO layer (including 5 weight % of SiO based on the total active material) is prepared by the same method as preparation example 2.

<Preparation of Half-Coin Cell Secondary Battery>

A half-coin cell secondary battery is prepared by the same method as preparation example 4 except that the prepared negative electrode is used.

Preparation Example 7

<Preparation of Negative Electrode>

A negative electrode of double layer structure of artificial graphite layer/SiO layer (including 5 weight % of SiO based on the total active material) is prepared by the same method as preparation example 2.

<Preparation of Positive Electrode>

Li(Ni$_{0.8}$Mn$_{0.1}$Co$_{0.1}$)O$_2$(NCM-811) as a positive electrode active material, carbon black (carbon black) as a conductive material and polyvinylidene fluoride (PVdF) as a binder are added to N-methylpyrrolidone (NMP) as a solvent at a weight ratio of 96:2:2 to prepare a positive electrode active material slurry. The slurry is coated on one surface of a 15 μm thick aluminum current collector, and drying and roll pressing is performed in the same condition as the negative electrode to prepare a positive electrode. In this instance, a loading amount is 20 mg/cm$^2$ based on the dry weight of the positive electrode active material layer.

<Preparation of 3-Electrode Secondary Battery>

LiPF$_6$ is dissolved in an organic solvent of ethylene carbonate (EC), propylenecarbonate (PC) and ethylmethyl carbonate (EMC) mixed at a volume ratio of 3:1:6 such that the concentration is LOM to prepare a nonaqueous electrolyte solution.

Subsequently, a reference electrode probe is interposed between the positive electrode and the separator in a pouch to prepare a 3-electrode secondary battery to measure a desired electrode potential while maintaining the configuration of the battery. In this instance, the reference electrode probe is prepared by coating a lithium titanium compound (LTO) as a reference electrode material on the lower end of the reference electrode probe.

(For reference, a needle element material of the reference electrode probe includes any type of material having no reactivity with the electrolyte solution or having very low conductivity without limitation. The needle element itself may be made of a material that may be used for the reference electrode, and in some cases, the needle element may be prepared by coating a material that may be used for the reference electrode on the lower end of the reference electrode probe).

EXPERIMENTAL EXAMPLE

Experimental Example 1

Figure 2A:
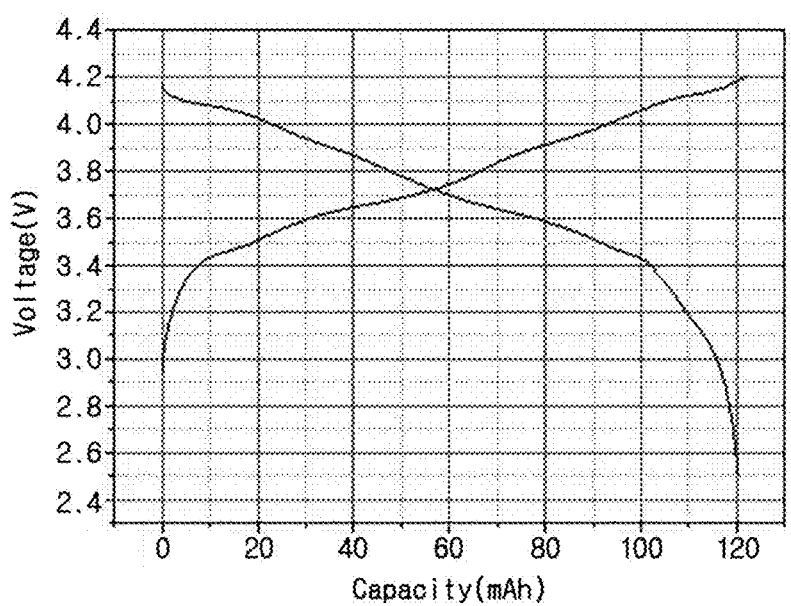
FIG. 2a is a graph showing changes in capacity vs voltage during 0.1 C charge/discharge of a three-electrode secondary battery (full cell) prepared in preparation example 7.
Figure 2B:
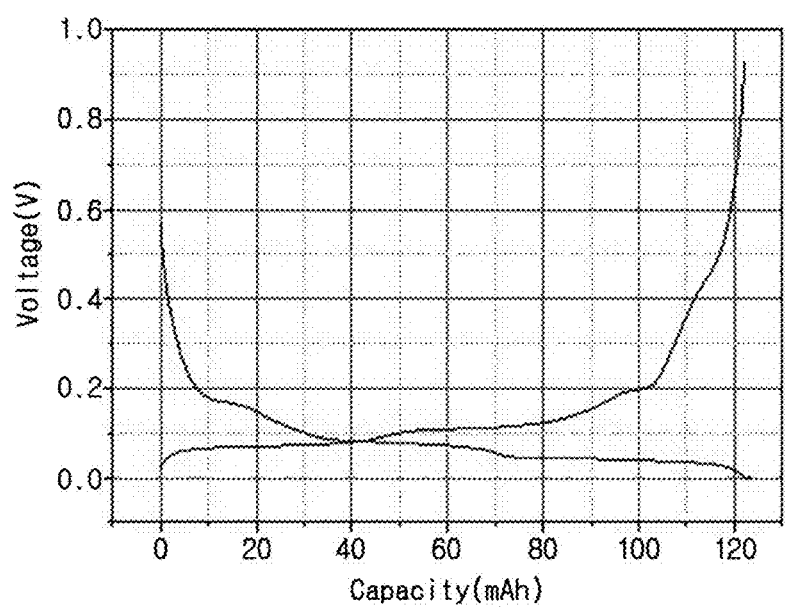
FIGS. 2b and 2c are graphs showing the profile of a negative electrode and a positive electrode of FIG. 2a respectively.
Figure 2C:
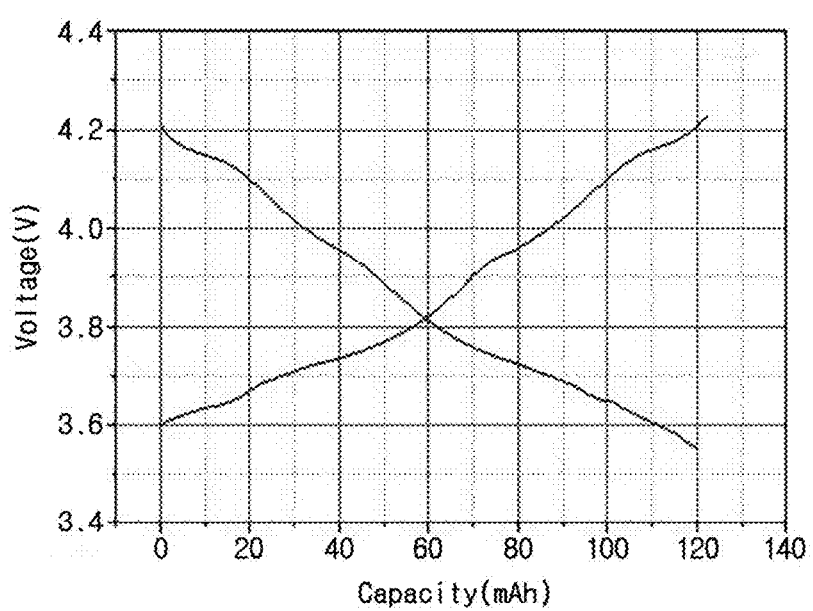

FIG. 2a shows changes in capacity vs voltage after 0.1 C charge/discharge of the three-electrode secondary battery (full cell) prepared in preparation example 7. FIGS. 2b and 2c show the profile of the negative electrode and the positive electrode, respectively, by reading the relative potential to the full cell potential in FIG. 2a using the reference potential (1.53V) of LTO as the needle element of the reference electrode.

Experimental Example 2

Figure 3A:
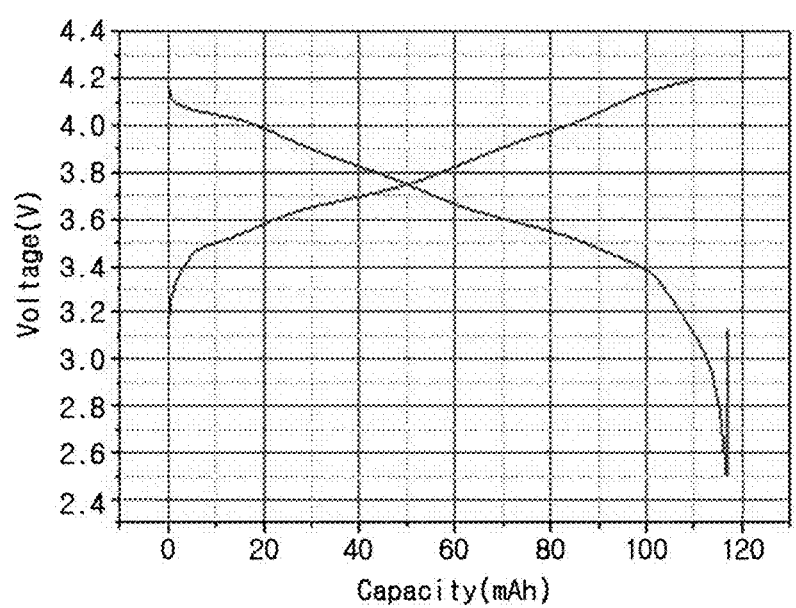
FIG. 3a is a graph showing changes in capacity vs voltage during 0.33 C charge/discharge of a three-electrode secondary battery (full cell) prepared in preparation example 7.
Figure 3B:
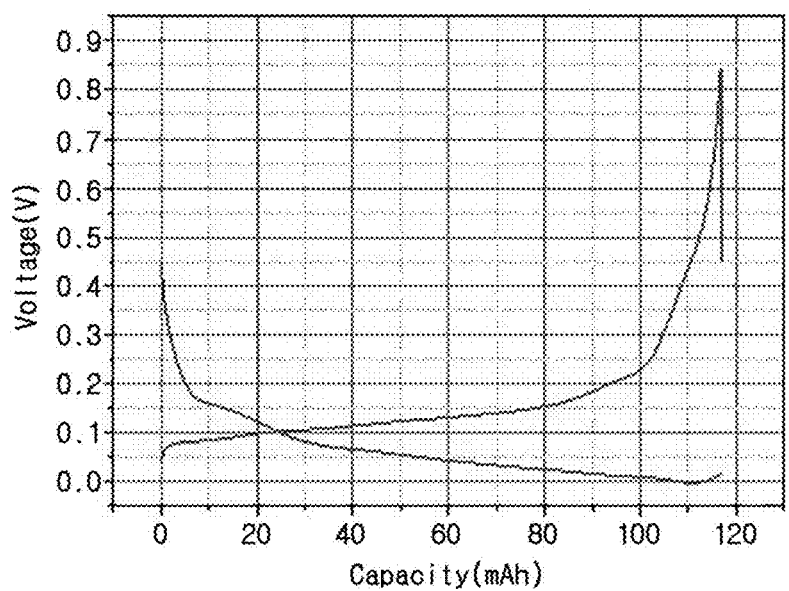
FIGS. 3b and 3c are graphs showing the profile of a negative electrode and a positive electrode of FIG. 3a, respectively.
Figure 3C:
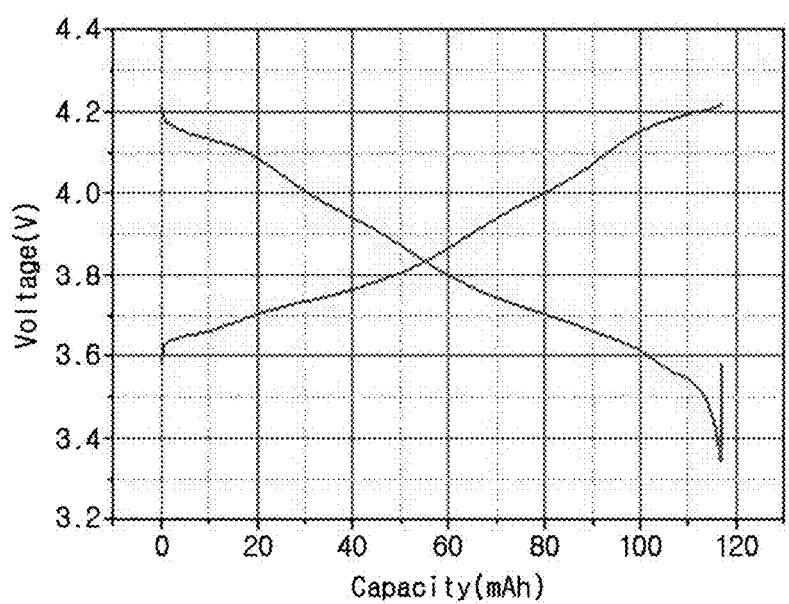

FIG. 3a shows changes of capacity vs voltage after 0.33 C charge/discharge of the three-electrode secondary battery (full cell) prepared in preparation example 7. FIGS. 3b and 3c show the profile of the negative electrode and the positive electrode, respectively, by reading the relative potential to the full cell potential of FIG. 3a using the reference potential (1.53V) of LTO as the needle element of the reference electrode.

Referring to FIGS. 2b and 3b, in the negative electrode of double layer structure of artificial graphite layer/SiO layer (including 5 weight % of SiO based on the total active material), it is difficult to separately analyze the behaviors of each of artificial graphite and SiO. In particular, when high C-rate is applied as shown in FIG. 3b, it is more difficult to separately analyze.

That is, in the conventional charge/discharge-voltage profile graph as shown in FIGS. 2a to 2c and FIGS. 3a to 3c, even though the negative electrode and the positive electrode are separately analyzed, it is impossible to determine how much SiO and graphite contribute to the total capacity of the batter in the hybrid negative electrode.

Experimental Example 3

Figure 4:
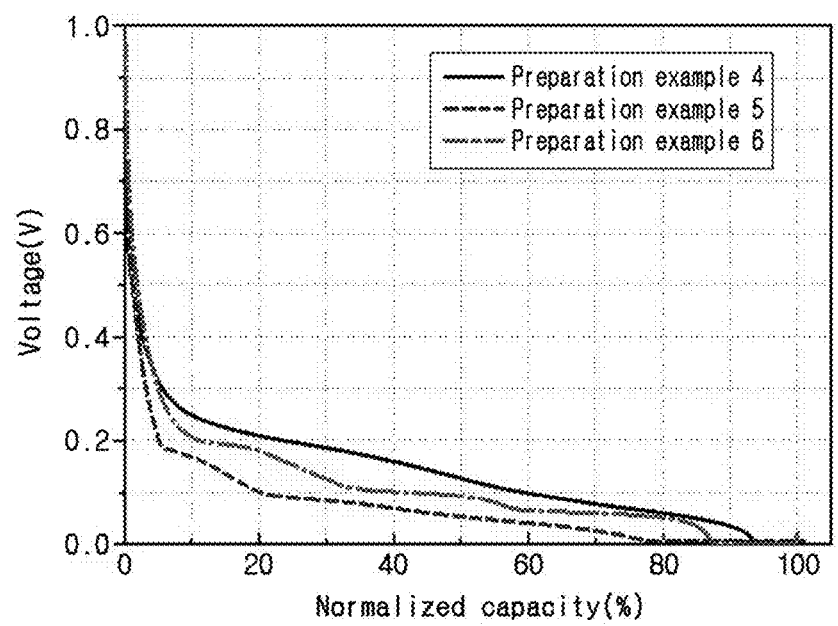
FIG. 4 is a graph showing the profile of each negative electrode of half-coin cell secondary batteries prepared in preparation examples 4 to 6 with changes in normalized capacity (%) and voltage.

In the half-coin cell secondary battery of the SiO single layer negative electrode prepared in preparation example 4, the half-coin cell secondary battery of the artificial graphite single layer negative electrode prepared in preparation example 5, and the half-coin cell secondary battery of the negative electrode of double layer structure of the artificial graphite layer/SiO layer (including 5 weight % of SiO based on the total active material) prepared in preparation example 6, the profile with changes in normalized capacity (%) and voltage for each negative electrode is shown in FIG. 4.

Referring to FIG. 4, it can be seen that it is difficult to clearly separate and analyze the profile of SiO and graphite in the profile of the hybrid negative electrode of preparation example 6.

Experimental Example 4

During the charge/discharge of the secondary batteries of preparation examples 1 to 3 in the same condition as the cycle testing, 0.33 CC/CV charge, 0.33 CC discharge, scanning is performed while tracking (002) lattice interface peak ($2\theta=7.5\sim11$ (Ag $\lambda=0.56$)) of artificial graphite included in the negative electrode of each secondary battery using the transmission x-ray diffractometer (Manufacturer: Bruker, Trade name: D8 Advance) shown in FIG. 5. The lattice d-spacing of artificial graphite is calculated by fitting the (002) lattice interface peak of artificial graphite included in the negative electrodes of preparation examples 1 to 3 obtained by scanning based on the Bragg's Law.

Figure 6:
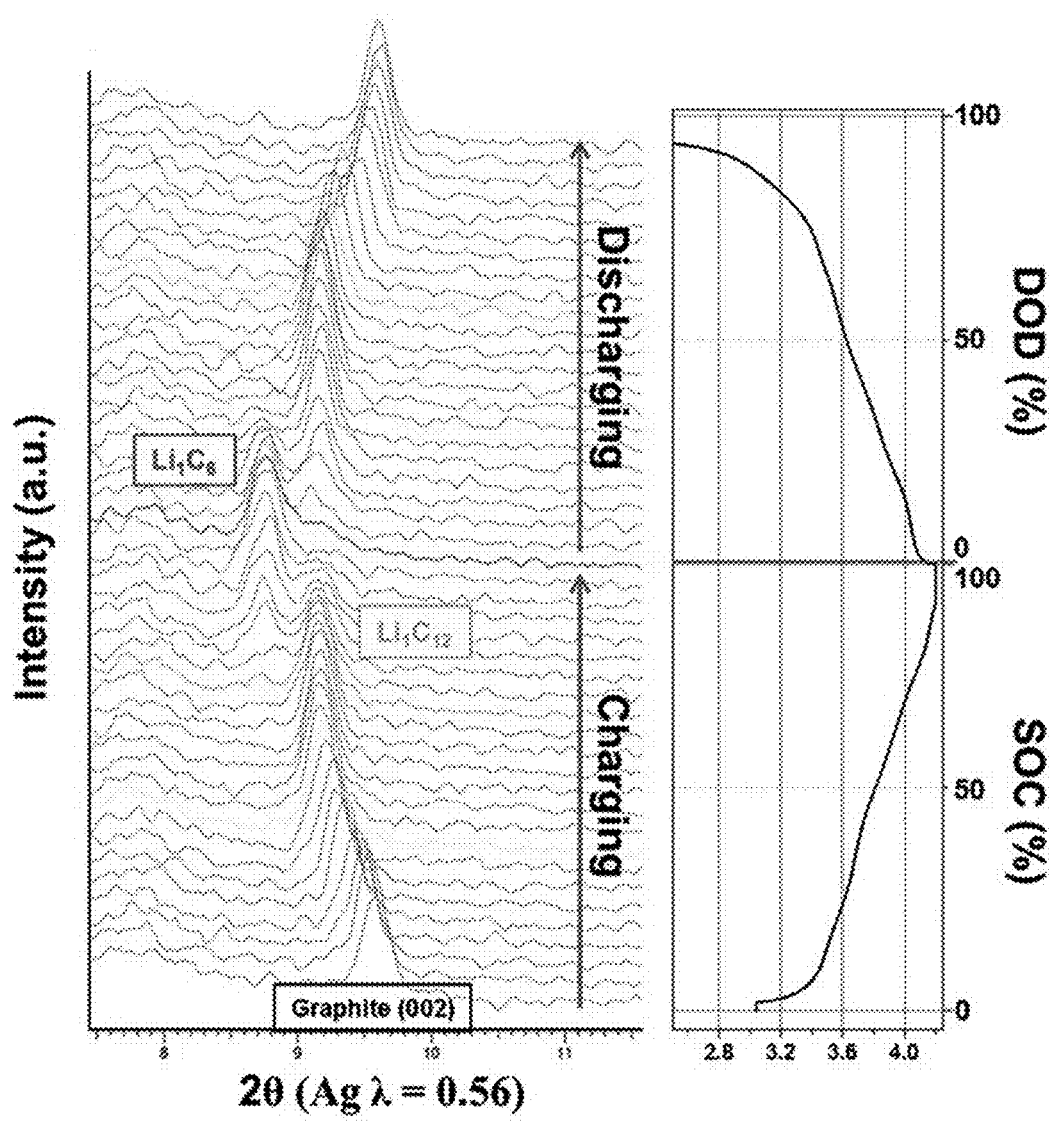
FIG. 6 is a graph showing the scan of (002) lattice interface peak ($2\theta=7.5\sim11$ (Ag $\lambda=0.56$)) of artificial graphite in a negative electrode of a secondary battery of preparation example 2 and lattice d-spacing calculated therefrom.

FIG. 6 is a graph typically showing the scan of (002) lattice interface peak ($2\theta=7.5\sim11$ (Ag $\lambda=0.56$)) of artificial graphite in the negative electrode (including 5 weight % of SiO based on the total active material) of the secondary battery of preparation example 2 using the X-ray diffractometer, and the lattice d-spacing calculated therefrom.

Figure 7A:
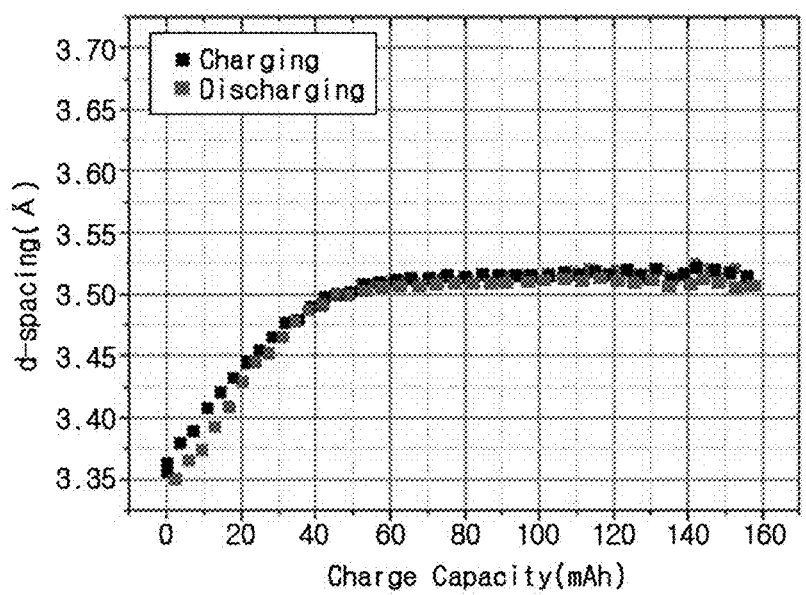
FIGS. 7a to 7c are graphs showing changes in lattice d-spacing of artificial graphite included in each negative electrode with changes in capacity during the charge/discharge of secondary batteries of preparation examples 1 to 3.
Figure 7B:
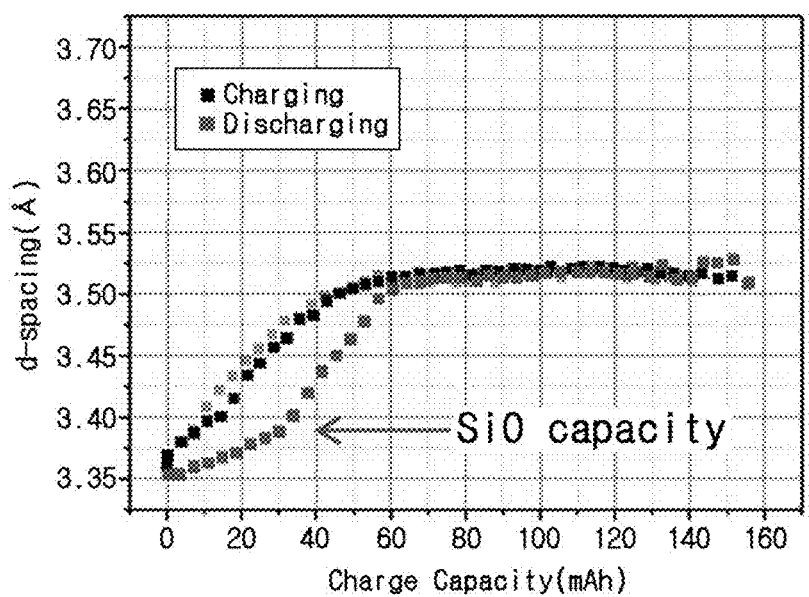
Figure 7C:
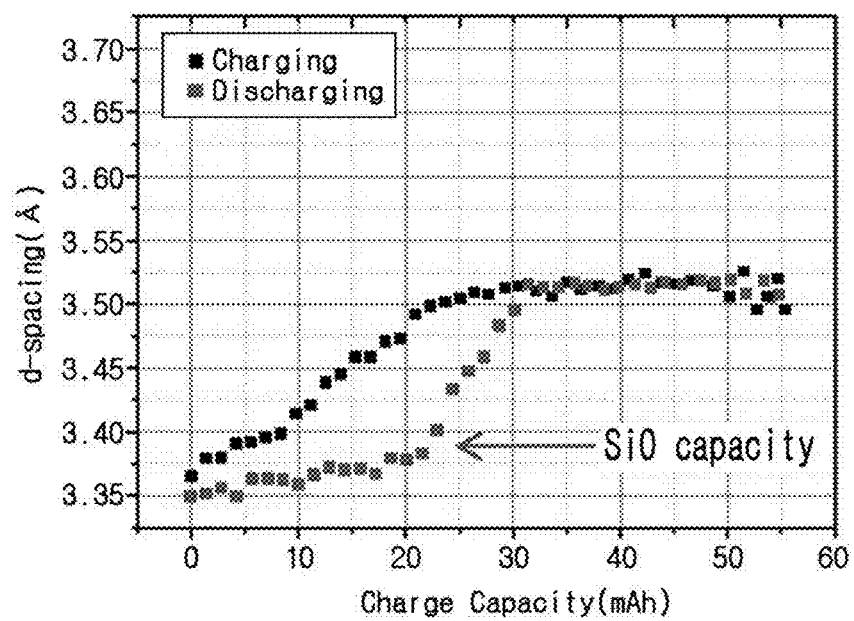

FIGS. 7a to 7c are graphs showing changes in lattice d-spacing of artificial graphite included in each negative electrode with changes in capacity during the charge/discharge of the secondary batteries of preparation examples 1 to 3.

Referring to FIG. 7a, when the negative electrode active material includes graphite alone like the negative electrode of preparation example 1, it can be seen that the lattice d-spacing of graphite uniformly increases during charging, and reduces along the path during discharging. Since the lithiation and delithiation of lithium ions in the graphite lattice takes place without interruption, as the capacity increases, the lattice d-spacing uniformly increases and then uniformly decreases.

According to FIG. 7b, it can be seen that in the case of preparation example 2 using the negative electrode including 5 weight % of SiO based on the total amount of the negative electrode active material of artificial graphite and SiO, the lattice d-spacing increasing curve during charging and the lattice d-spacing decreasing curve during discharging do not match, and there is a difference in path.

FIG. 7b has an inflection point at the discharge capacity of about 25 mAh in the graph curve during discharging. In a higher capacity range than the capacity at the inflection point, changes in graphite lattice are very large with changes in capacity, and the discharge capacity at that time is attributed to delithiation of lithium ions in graphite.

Meanwhile, it can be seen that in the lower capacity range than the capacity at the inflection point, i.e., the discharge capacity in the range of about 25 to 0 mAh, the lattice d-spacing of graphite relatively less reduces with changes in capacity. This discharge capacity range corresponds to a range reflecting lithiation of lithium ions in SiO, not delithiation of lithium ions in graphite. Accordingly, the capacity contribution of SiO in the secondary battery applied to the charge/discharge is 25 mAh based on the total discharge capacity of 160 mAh, i.e., 15.6% ($=25/160\times100$). It can be seen that this almost matches the theoretical value of contribution of about 15% of the total capacity when SiO is included in an amount of 5 weight % based on the total negative electrode active material of graphite and SiO.

After lithiation of lithium ions in both graphite and SiO during charging, during discharging, delithiation of lithium ions in graphite occurs in the higher capacity range than the capacity at the inflection point, and subsequently, delithiation of lithium ions in SiO occurs in the lower capacity range than the capacity at the inflection point, and accordingly even though the capacity changes, the decreasing tendency of lattice d-spacing of graphite noticeably reduces.

FIG. 7c is a graph showing changes in lattice d-spacing of graphite as a function of charge capacity in the secondary battery of preparation example 3 using the negative electrode including 15 weight % of SiO based on the total amount of the negative electrode active material of artificial graphite and SiO.

FIG. 7c has an inflection point at the discharge capacity of about 24 mAh in the graph curve during discharging. In the higher capacity range than the capacity at the inflection point, the lattice d-spacing of graphite changes and the capacity also changes. The discharge capacity at that time is attributed to the delithiation of lithium ions in graphite.

Meanwhile, there is no or little change in graphite lattice d-spacing in the lower capacity range than the capacity at the inflection point, i.e., in the discharge capacity range of about 24 to 0 mAh, but nevertheless the capacity changes. During discharging, delithiation of lithium ions in graphite does not occur, and delithiation of lithium ions in SiO occurs. Accordingly, the discharge capacity results from delithiation of lithium ions in SiO. Based on this, the capacity contribution of SiO in the secondary battery applied to the charge/discharge is 24 mAh based on the total discharge capacity of 55 mAh, i.e., 43.6% (=24/55×100). It can be seen that this almost matches the theoretical value of contribution of about 45% of the total capacity when SiO is included in an amount of 15 weight % in the total negative electrode active material of graphite and SiO.

Figure 8:
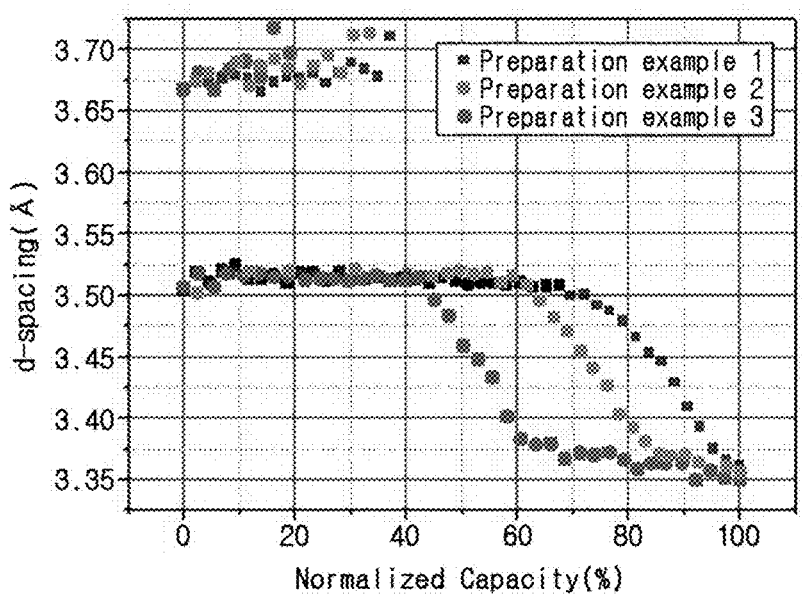
FIG. 8 is a graph showing changes in lattice d-spacing of artificial graphite included in each negative electrode with changes in normalized capacity during the charge/discharge of secondary batteries of preparation examples 1 to 3.

FIG. 8 is a graph showing changes in lattice d-spacing of artificial graphite included in each negative electrode with changes in normalized capacity during the charge/discharge of the secondary batteries of preparation examples 1 to 3.

At the charge capacity of the secondary battery of preparation example 3 comprising the carbon based hybrid negative electrode including 85 weight % of graphite and 15 weight % of SiO, the latter part plateau range of 57~100%, i.e., 43%, is the capacity value exhibited by SiO. It can be seen that it snatches the calculated value of FIG. 7c.

At the charge capacity of the secondary battery of preparation example 2 comprising the carbon based hybrid negative electrode including 85 weight % of graphite and 5 weight % of SiO, the latter part plateau range of 85-100%, i.e., 15%, is the capacity value exhibited by SiO. It can be seen that it matches the calculated value of FIG. 7b.

What is claimed is:

1. A method of quantitatively analyzing a carbon based hybrid negative electrode, comprising:
    preparing a secondary battery comprising the carbon based hybrid negative electrode, wherein the carbon based hybrid negative electrode comprises a carbon based negative electrode active material and a non-carbon based negative electrode active material;
    measuring a lattice d-spacing of the carbon based negative electrode active material in the carbon based hybrid negative electrode during charging/discharging of the secondary battery using an X-ray diffractometer,
    plotting a graph of a change in lattice d-spacing value as a function of charge/discharge capacity;
    detecting an inflection point of a slope of the graph during discharging; and
    quantifying capacity contribution of the carbon based negative electrode active material and the non-carbon based negative electrode active material in a total discharge capacity of the secondary battery by the inflection point of the slope of the graph.

2. The method of quantitatively analyzing the carbon based hybrid negative electrode according to claim 1, wherein a discharge capacity after the inflection point corresponds to the capacity contribution of the non-carbon based negative electrode active material, and a discharge capacity before the inflection point corresponds to the capacity contribution of the carbon based negative electrode active material.

3. The method of quantitatively analyzing the carbon based hybrid negative electrode according to claim 1, wherein the capacity contribution of the non-carbon based negative electrode active material in the carbon based hybrid negative electrode is quantified by calculating a ratio of a discharge capacity after the inflection point to a maximum capacity of the graph.

4. The method of quantitatively analyzing the carbon based hybrid negative electrode according to claim 1, wherein when capacity characteristics degrade as the secondary battery is charged/discharged multiple times, a change in the inflection point of the slope of the graph during charge/discharge after degradation by the multiple charge/discharge is compared to the inflection point of the slope of the graph during initial charge/discharge to determine a cause of degradation of the secondary battery.

5. The method of quantitatively analyzing the carbon based hybrid negative electrode according to claim 4, wherein as a result of analyzing the inflection point location of the slope of the graph during charge/discharge after degradation compared to the inflection point location of the slope of the graph during initial charge/discharge, a reduction in capacity from the inflection point to the maximum capacity is determined as a degradation of the carbon based negative electrode active material, and a reduction in capacity from the inflection point to capacity 0 is determined as a degradation of the non-carbon based negative electrode active material.

6. The method of quantitatively analyzing the carbon based hybrid negative electrode according to claim 1, wherein the carbon based negative electrode active material comprises at least one of natural graphite, artificial graphite, soft carbon, hard carbon, pitch carbide, sintered cokes, graphene, or carbon nano tubes.

7. The method of quantitatively analyzing the carbon based hybrid negative electrode according to claim 1, wherein the non-carbon based negative electrode active material comprises a metal or metalloid capable of forming an alloy with lithium.

8. The method of quantitatively analyzing the carbon based hybrid negative electrode according to claim 1, wherein the non-carbon based negative electrode active material comprises at least one of a metal or metalloid selected from Si, Sn, In, Pb, Ga, Ge, Al, Bi, Sb, Ag, Mg, Zn, Pt, or Ti; an oxide of the metal or metalloid; a carbon composite of the metal or metalloid; or a carbon composite of the metal or metal oxide.

9. The method of quantitatively analyzing the carbon based hybrid negative electrode according to claim 1, wherein the non-carbon based negative electrode active material comprises at least one of Si or $SiO_x$, wherein $0<x<2$.

* * * * *